(12) United States Patent
Kubo et al.

(10) Patent No.: US 11,532,487 B2
(45) Date of Patent: Dec. 20, 2022

(54) SUBSTRATE PROCESSING APPARATUS

(71) Applicant: Tokyo Electron Limited, Tokyo (JP)

(72) Inventors: Akihiro Kubo, Koshi (JP); Yasushi Takiguchi, Koshi (JP); Teruhiko Kodama, Koshi (JP); Yoshiki Okamoto, Koshi (JP); Hayato Hosaka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 81 days.

(21) Appl. No.: 16/872,441

(22) Filed: May 12, 2020

(65) Prior Publication Data
US 2020/0365417 A1   Nov. 19, 2020

(30) Foreign Application Priority Data

May 14, 2019   (JP) .............................. JP2019-091560

(51) Int. Cl.
| | |
|---|---|
| *H01L 21/461* | (2006.01) |
| *H01L 21/67* | (2006.01) |
| *B24B 37/04* | (2012.01) |
| *H01L 21/306* | (2006.01) |

(52) U.S. Cl.
CPC ............ *H01L 21/461* (2013.01); *B24B 37/04* (2013.01); *H01L 21/30625* (2013.01); *H01L 21/67028* (2013.01); *H01L 21/67253* (2013.01)

(58) Field of Classification Search
None
See application file for complete search history.

(56) References Cited

U.S. PATENT DOCUMENTS

| | | | | |
|---|---|---|---|---|
| 4,481,738 | A * | 11/1984 | Tabuchi | B24B 27/0023 15/4 |
| 5,990,010 | A * | 11/1999 | Berman | B24B 53/017 438/692 |
| 2005/0282475 | A1* | 12/2005 | Lujan | B24B 53/003 451/56 |
| 2014/0308878 | A1* | 10/2014 | Baumann | H01L 21/304 451/41 |
| 2018/0117729 | A1* | 5/2018 | Yasuda | B24B 53/017 |
| 2019/0152020 | A1* | 5/2019 | Lan | B24B 53/017 |
| 2020/0094375 | A1* | 3/2020 | Tsai | B24B 49/16 |
| 2020/0365417 | A1* | 11/2020 | Kubo | H01L 21/30625 |

FOREIGN PATENT DOCUMENTS

JP   2018-093178 A   6/2018

* cited by examiner

*Primary Examiner* — Sylvia MacArthur
(74) *Attorney, Agent, or Firm* — Pearne & Gordon LLP

(57) ABSTRACT

A substrate processing apparatus includes a polishing member having a polishing surface configured to perform a polishing of a main surface of a substrate; a first dressing member having a first dressing surface configured to perform a dressing of the polishing surface; a second dressing member having a second dressing surface configured to perform a dressing of the first dressing surface; a holding member configured to hold the polishing member and the second dressing member; and a driving unit configured to, by moving the holding member, switch a first state in which the first dressing surface and the polishing surface come into contact with each other to perform the dressing of the polishing surface and a second state in which the first dressing surface and the second dressing surface come into contact with each other to perform the dressing of the first dressing surface.

12 Claims, 11 Drawing Sheets

SUBSTRATE PROCESSING APPARATUS

CROSS-REFERENCE TO RELATED APPLICATION

This application claims the benefit of Japanese Patent Application No. 2019-091560 filed on May 14, 2019, the entire disclosure of which is incorporated herein by reference.

TECHNICAL FIELD

The various aspects and embodiments described herein pertain generally to a substrate processing apparatus and a substrate processing method.

BACKGROUND

Patent Document 1 describes a substrate processing apparatus configured to polish a rear surface of a substrate. This substrate processing apparatus is equipped with a sliding member configured to be rotated around a vertical axis of rotation to perform a processing while being slid on the rear surface of the substrate; a revolving device configured to revolve the sliding member, which is being rotated, around a vertical axis of revolution; and a relative moving device configured to move relative positions of the substrate and an orbit of revolution of the sliding member in a horizontal direction.

Patent Document 1: Japanese Patent Laid-open Publication No. 2018-093178.

SUMMARY

In one exemplary embodiment, a substrate processing apparatus includes a polishing member having a polishing surface configured to perform a polishing of a main surface of a substrate; a first dressing member having a first dressing surface configured to perform a dressing of the polishing surface; a second dressing member having a second dressing surface configured to perform a dressing of the first dressing surface; a holding member configured to hold the polishing member and the second dressing member; and a driving unit configured to, by moving the holding member, switch a first state in which the first dressing surface and the polishing surface come into contact with each other to perform the dressing of the polishing surface and a second state in which the first dressing surface and the second dressing surface come into contact with each other to perform the dressing of the first dressing surface.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
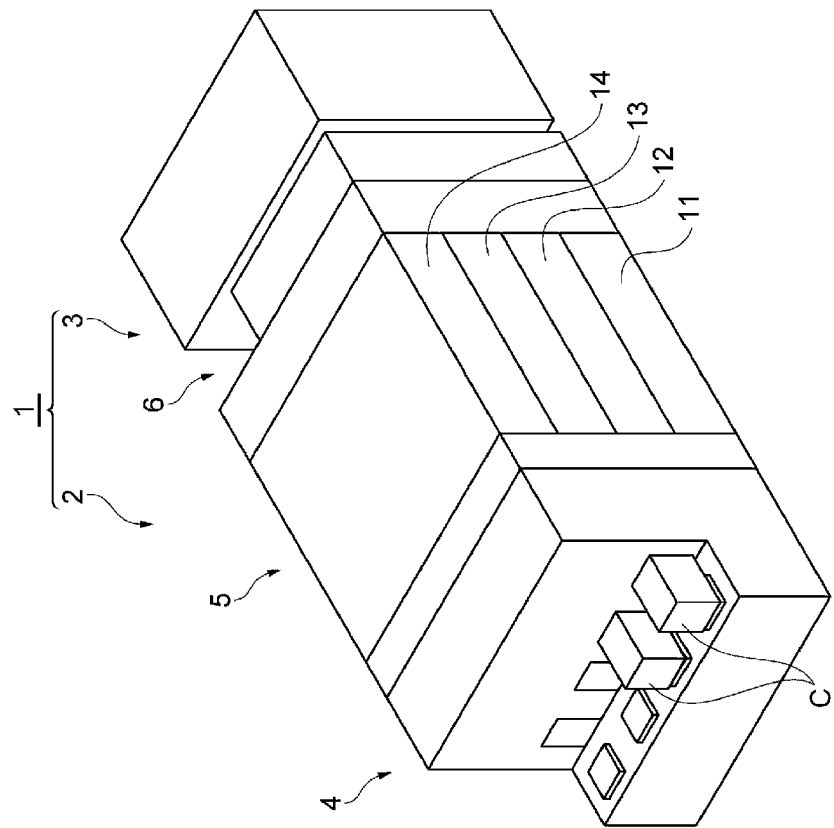
FIG. 1 is a schematic diagram illustrating an example of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described.

A substrate processing apparatus includes a polishing member having a polishing surface configured to perform a polishing of a main surface of a substrate; a first dressing member having a first dressing surface configured to perform a dressing of the polishing surface; a second dressing member having a second dressing surface configured to perform a dressing of the first dressing surface; a holding member configured to hold the polishing member and the second dressing member; and a driving unit configured to, by moving the holding member, switch a first state in which the first dressing surface and the polishing surface come into contact with each other to perform the dressing of the polishing surface and a second state in which the first dressing surface and the second dressing surface come into contact with each other to perform the dressing of the first dressing surface.

In this substrate processing apparatus, the dressing of the polishing surface is performed in the first state, and the dressing of the first dressing surface is performed in the second state. As the dressing of the polishing surface is performed, a polishing processing upon the substrate is carried out stably. However, the first dressing surface of the first dressing member is abraded. Since, however, the dressing of the first dressing surface is performed by the second dressing surface, the abraded portion of the first dressing surface is sharpened. Therefore, the dressing of the polishing surface is performed in the state that the abrasion state of the first dressing surface is improved. As a result, the stable polishing processing can be carried on.

The second dressing member and the polishing member may be fixed on a single surface of the holding member, and height positions of the polishing surface and the second dressing surface may be different. The first dressing surface may face the polishing surface and the second dressing surface. The driving unit may switch the first state and the second state by changing positions of the polishing surface and the second dressing surface when viewed from a top, and, also, by changing a distance between the holding member and the first dressing surface. In this case, the second dressing member for maintaining a quality of the first dressing surface and the polishing member including the polishing surface are provided on the surface facing the first dressing surface. With this configuration, the stable polishing processing can be carried on without needing to scale up the apparatus which performs the polishing of the substrate.

A hardness of the second dressing member may be lower than a hardness of the first dressing member. In this case, since the member as the dressing target is stronger than the member which performs the dressing, the sharpening of the first dressing surface of the first dressing member can be carried out more securely.

The driving unit may move a contact position of the second dressing surface in the second state to cover a contact area of the first dressing surface which has been in contact with the polishing surface when the dressing of the polishing surface is performed in the first state. The contact region of the first dressing surface is abraded as the dressing of the polishing surface is performed. In the above-described configuration, since the dressing upon the first dressing surface is performed to cover the contact region which is abraded, the degree of the dressing of the polishing surface by the first dressing surface can be stabilized more securely.

The substrate processing apparatus may further include a controller configured to control the driving unit. The driving unit may include a first driving unit configured to rotate the holding member to allow the polishing member to be rotated around a first axis, and a second driving unit configured to move the holding unit to allow the first axis to be moved along a circular orbit around a second axis which is parallel to the first axis. The controller may control the first driving unit to rotate the holding member so that positions of the polishing surface and the second dressing surface when viewed from a top may be changed. The controller may control the second driving unit to move the holding member so that the contact position of the second dressing surface with respect to the contact area may be moved in the second state. In this case, the second dressing surface can be moved within a wide range through the operation of the holding member which is driven by the second driving unit. Therefore, when the dressing of the first dressing surface is performed, it is easy to cover the contact region.

The substrate processing apparatus may further include a controller configured to acquire polishing information which indicates a polished state of the main surface of the substrate after the polishing is performed by the polishing member. The controller may determine, based on the polishing information, whether or not to perform the dressing of the first dressing surface. Depending on the polishing state of the substrate, the dressing of the first dressing surface may not be required. In the above-described configuration, as it is determined based on the polishing information indicating the polishing state whether or not to perform the dressing of the first dressing surface, a lifetime of the second dressing member can be lengthened.

The substrate processing apparatus may further include a controller configured to acquire abrasion information which indicates an abrasion state of at least one of the first dressing surface or the second dressing surface. The controller may determine, based on the abrasion information, whether or not to perform the dressing of the first dressing surface. Depending on the abrasion state of the first dressing surface or the second dressing surface, the dressing of the first dressing surface may not be required. In the above-described configuration, as it is determined based on the abrasion information indicating the abrasion state whether or not to perform the dressing of the first dressing surface, the lifetime of the second dressing member can be further lengthened.

The dressing of the polishing surface may be performed whenever the polishing upon the substrate as a processing target is performed. The driving unit may perform a switchover from the first state into the second state after the dressing of the polishing surface is performed multiple times. After the dressing of the polishing surface is performed a single time, the dressing of the first dressing surface may not be required. In the above-described configuration, since the dressing of the first dressing surface is performed after the dressing of the polishing surface is performed the multiple times, the lifetime of the second dressing member can be further lengthened.

A substrate processing method is performed by a polishing unit including a polishing member having a polishing surface configured to polish a main surface of a substrate; a first dressing member having a first dressing surface configured to perform a dressing of the polishing surface; a second dressing member having a second dressing surface configured to perform a dressing of the first dressing surface; and a holding member configured to hold the polishing member and the second dressing member. The substrate processing method includes performing the dressing of the polishing surface by bringing the first dressing surface and the polishing surface into contact with each other; performing the dressing of the first dressing surface by bringing the first dressing surface and the second dressing surface into contact with each other; and switching, by moving the holding member, a first state in which the dressing of the polishing surface is performed and a second state in which the dressing of the first dressing surface is performed.

Hereinafter, the various exemplary embodiments will be described in detail with reference to the accompanying drawings. In the following description, same parts or parts having same functions will be assigned same reference numerals, and redundant description will be omitted.

[Substrate Processing System]

A substrate processing system 1 is a system configured to perform formation of a photosensitive film on a substrate, exposure of the corresponding photosensitive film and development of the corresponding photosensitive film. The substrate as a processing target object is, for example, a semiconductor wafer W. The photosensitive film is, by way of non-limiting example, a resist film. The substrate processing system 1 includes a coating and developing apparatus 2 and an exposure apparatus 3. The exposure apparatus 3 is configured to perform an exposure processing of the resist film (photosensitive film) formed on the wafer W (substrate). To elaborate, the exposure apparatus 3 irradiates an energy beam to an exposure target portion of the resist film by an immersion exposure method or the like. The coating and developing apparatus 2 is configured to perform a processing of forming the resist film on a surface of the wafer W (substrate) prior to the exposure processing by the exposure apparatus 3, and then, perform a developing processing on the resist film after the exposure processing.

[Substrate Processing Apparatus]

Figure 2:
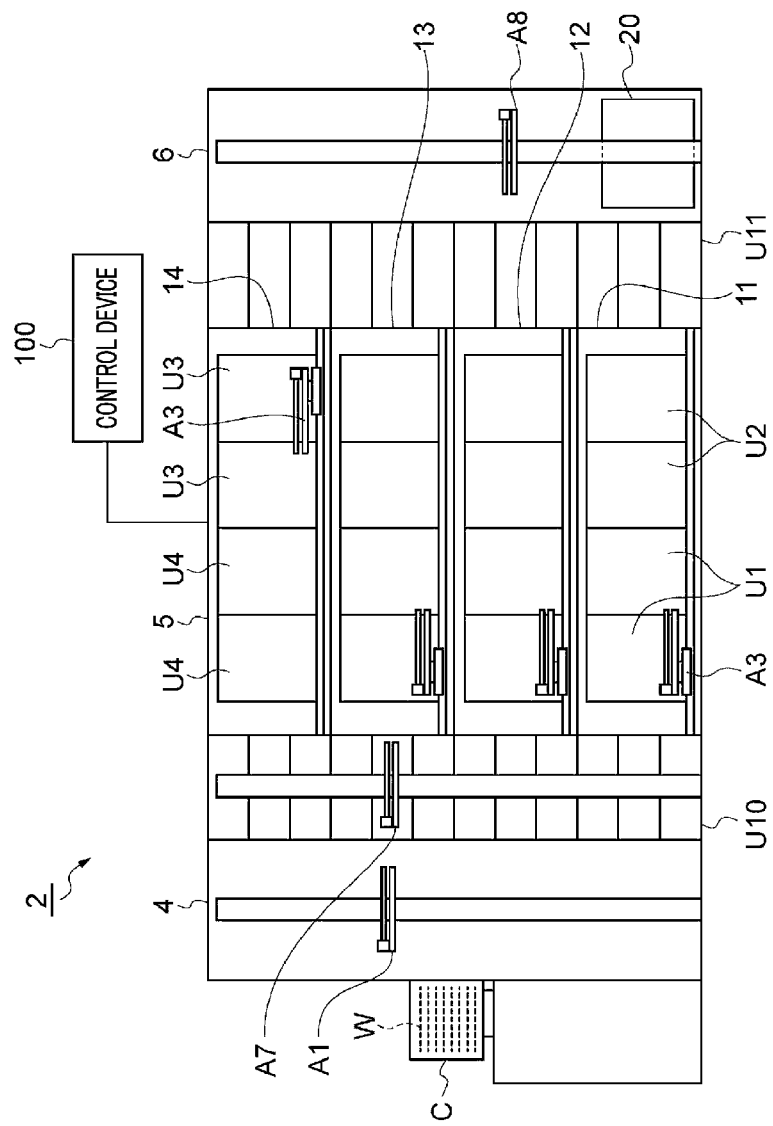
FIG. 2 is a diagram illustrating an example of a coating and developing apparatus.

Below, a configuration of the coating and developing apparatus 2 as an example of a substrate processing apparatus will be explained. As depicted in FIG. 1 and FIG. 2, the coating and developing apparatus 2 is equipped with a carrier block 4, a processing block 5, an interface block 6, a polishing unit 20, and a control device 100 (controller).

The carrier block 4 is configured to carry a wafer W into/from the coating and developing apparatus 2. For example, the carrier block 4 is configured to support a plurality of carriers C for wafers W and incorporates therein a transfer device A1 including a delivery arm. Each carrier C accommodates therein, for example, a multiple number of circular wafers W. The transfer device A1 is configured to take out a wafer W from the carrier C, hand the wafer W over to the processing block 5, receive the wafer W from the processing block 5 and return the wafer W back into the carrier C.

The processing block 5 includes multiple processing modules 11, 12, 13 and 14. Each of the processing modules 11, 12 and 13 incorporates coating units U1, heat treatment units U2 and a transfer device A3 including a transfer arm configured to transfer the wafer W into these units.

The processing module 11 is configured to form a bottom film on the surface of the wafer W by the coating unit U1 and the heat treatment unit U2. The coating unit U1 of the processing module 11 is configured to coat a processing liquid for forming the bottom film on the wafer W. The heat treatment unit U2 of the processing module 11 is configured to perform various kinds of heat treatments required to form the bottom film.

The processing module 12 is configured to form a resist film on the bottom film by the coating unit U1 and the heat treatment unit U2. The coating unit U1 of the processing module 12 is configured to coat a processing liquid for forming the resist film on the bottom film. The heat treatment unit U2 of the processing module 12 is configured to perform various kinds of heat treatments required to form the resist film.

The processing module 13 is configured to form a top film on the resist film by the coating unit U1 and the heat treatment unit U2. The coating unit U1 of the processing module 13 is configured to coat a liquid for forming the top film on the resist film. The heat treatment unit U2 of the processing module 13 is configured to perform various kinds of heat treatments required to form the top film.

The processing module 14 incorporates therein developing units U3, heat treatment units U4, and a transfer device A3 configured to transfer the wafer W into these units. The processing module 14 is configured to perform a developing processing of the exposed resist film by the developing unit U3 and the heat treatment unit U4. The developing unit U3 is configured to perform the developing processing of the resist film by coating a developing liquid on the surface of the exposed wafer W and washing it with a rinse liquid. The heat treatment unit U4 is configured to perform various kinds of heat treatments required for the developing processing. Specific examples of these heat treatments include a heat treatment (PEB: Post Exposure Bake) performed before the developing processing, a heat treatment (PB: Post Bake) performed after the developing processing, and so forth.

Within the processing block 5, a shelf unit U10 is provided at a side of the carrier block 4. The shelf unit U10 is partitioned into a multiple number of cells arranged in the vertical direction. A transfer device A7 including an elevation arm is provided in the vicinity of the shelf unit U10. The transfer device A7 is configured to move the wafer W up and down among the cells of the shelf unit U10.

Within the processing block 5, a shelf unit U11 is provided at a side of the interface block 6. The shelf unit U11 is partitioned into multiple cells which are arranged in the vertical direction.

The interface block 6 is configured to deliver the wafer W into/from the exposure apparatus 3. In the present exemplary embodiment, the polishing unit 20 configured to perform a polishing processing on the wafer W is disposed within the interface block 6. By way of example, the interface block 6 incorporates a transfer device A8 including a delivery arm, and is connected to the exposure apparatus 3. The transfer device A8 delivers the wafer W placed in the shelf unit U11 to the polishing unit 20, and then delivers the wafer W polished in the polishing unit 20 to the exposure apparatus 3. The transfer device A8 receives the wafer W from the exposure apparatus 3 and returns the received wafer W back into the shelf unit U11.

The control device 100 controls the coating and developing apparatus 2 to perform a coating and developing processing according to the following sequence, for example. First, the control device 100 controls the transfer device A1 to transfer the wafer W within the carrier C to the shelf unit U10, and controls the transfer device A7 to place this wafer W in the cell for the processing module 11.

Then, the control device 100 controls the transfer device A3 to transfer the wafer W of the shelf unit U10 into the coating unit U1 and the heat treatment unit U2 within the processing module 11, and controls the coating unit U1 and the heat treatment unit U2 to form the bottom film on the surface of the wafer W. Thereafter, the control device 100 controls the transfer device A3 to return the wafer W having the bottom film formed thereon back into the shelf unit U10, and then controls the transfer device A7 to place this wafer W in the cell for the processing module 12.

Subsequently, the control device 100 controls the transfer device A3 to transfer the wafer W of the shelf unit U10 into the coating unit U1 and the heat treatment unit U2 within the processing module 12, and controls the coating unit U1 and the heat treatment unit U2 to form the resist film on the bottom film of the wafer W. Thereafter, the control device 100 controls the transfer device A3 to return the wafer W back into the shelf unit U10, and controls the transfer device A7 to place this wafer W in the cell for the processing module 13.

Afterwards, the control device 100 controls the transfer device A3 to transfer the wafer W of the shelf unit U10 to the individual units within the processing module 13 and controls the coating unit U1 and the heat treatment unit U2 to form the top film on the resist film of the wafer W. Then, the control device 100 controls the transfer device A3 to transfer the wafer W to the shelf unit U11.

Thereafter, the control device 100 controls the transfer device A8 to deliver the wafer W of the shelf unit U11 to the polishing unit 20 and, then, to deliver the wafer W polished in the polishing unit 20 to the exposure apparatus 3. Then, the control device 100 controls the transfer device A8 to receive the exposed wafer W from the exposure apparatus 3 and place the received wafer W in the cell within the shield unit U11 for the processing module 14.

Thereafter, the control device 100 controls the transfer device A3 to transfer the wafer W of the shelf unit U11 into the individual units within the processing module 14, and controls the developing unit U3 and the heat treatment unit U4 to perform the developing processing on the resist film of the wafer W. Then, the control device 100 controls the transfer device A3 to return the wafer W to the shelf unit U10, and controls the transfer device A7 and the transfer device A1 to return this wafer W back into the carrier C. Then, the coating and developing processing is completed.

A specific configuration of the substrate processing apparatus is not limited to the above-described configuration of the coating and developing apparatus 2. The substrate processing apparatus may be implemented by any of various types of apparatuses as long as it is equipped with the polishing unit 20 and the control device 100 configured to control this polishing unit 20. The coating and developing apparatus 2 may perform the polishing processing on the wafer W by the polishing unit 20 at any time before the exposure processing by the exposure apparatus 3 is performed. By way of example, the coating and developing apparatus 2 may perform the polishing processing on the wafer W before or after the processings by the coating unit U1 and the heat treatment unit U2 in the processing module 11 or 12, or before the processings by the coating unit U1 and the heat treatment unit U2 in the processing module 13. In the coating and developing apparatus 2, the polishing unit 20 may be disposed within the carrier block 4 or the processing modules 11, 12 and 13.

<Polishing Unit>

Figure 3:
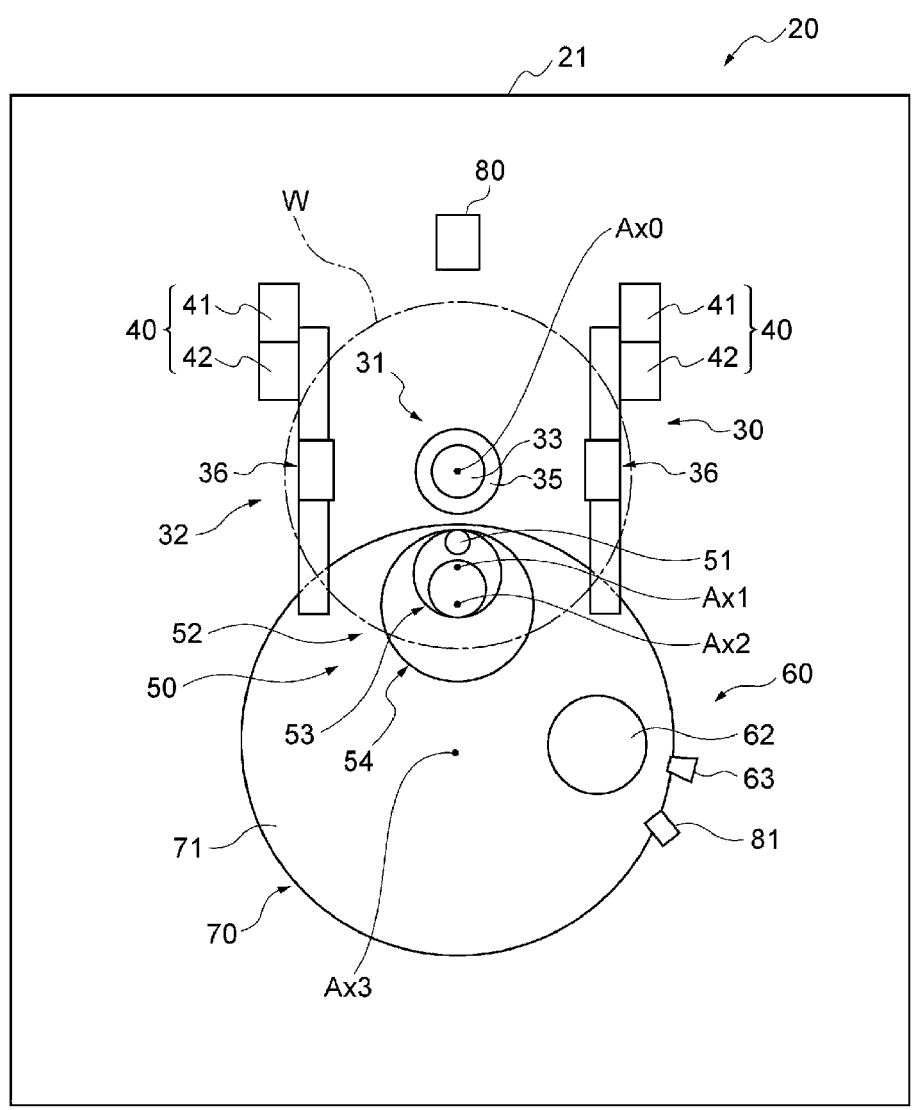
FIG. 3 is a top view schematically illustrating an example of a polishing unit.

Now, an example of a detailed configuration of the polishing unit 20 will be elaborated with reference to FIG. 3 to FIG. 6B. Further, in FIG. 4 to FIG. 6B, some of components shown in FIG. 3 are omitted. The polishing unit 20 shown in FIG. 3 is a unit configured to polish a rear surface Wb (main surface) of the wafer W opposite to a front surface Wa of the wafer W on which the resist film is to be formed. The polishing unit 20 is configured to roughen the rear surface Wb of the wafer W by polishing the rear surface Wb with a polishing member configured to be slid on the rear surface Wb. The polishing unit 20 may polish a central region and a peripheral region of the rear surface Wb of the wafer W having, for example, the circular shape individually.

The polishing processing (polishing) by the polishing unit 20 is performed to reduce a contact area between the rear surface Wb of the wafer W and a stage of, for example, the exposure apparatus 3 when the wafer W is placed on this stage. The polishing unit 20 includes a housing 21, a substrate holder 30, a switching unit 40, a polishing unit 50, a dressing unit 60, a revolving unit 70 and an inspecting unit 80.

The housing 21 accommodates therein the substrate holder 30, the switching unit 40, the polishing unit 50, the dressing unit 60, the revolving unit 70 and the inspecting unit 80. The housing 21 has an internal space and is formed to have, for example, a substantially rectangular parallelepiped shape. An opening is provided at one end of the housing 21, and the transfer device A8 carries the wafer W into/from the polishing unit 20 through this opening. In the following, a direction of a longer side of an outline of the housing 21 when viewed from the top (from vertically above) will be referred to as "forward-backward" direction," whereas a direction of a shorter side will be referred to as "left-right" direction, for the convenience of explanation.

The substrate holder 30 is configured to hold the rear surface Wb of the wafer W when the wafer W is polished.

To elaborate, the substrate holder 30 is configured to rotate the wafer W while holding a peripheral region of the wafer W when polishing of a central region of the wafer W (hereinafter, referred to as "center polishing") is performed and while holding the central region of the wafer W when polishing of the peripheral region of the wafer W (hereinafter, referred to as "periphery polishing") is performed. The substrate holder 30 is equipped with a rotary holder 31 and a periphery holder 32.

The rotary holder 31 holds the central region of the rear surface Wb of the wafer W when the periphery polishing of the wafer W is performed. The rotary holder 31 may be fixed at a preset position when viewed from the top. The rotary holder 31 is equipped with a spin chuck 33, a shaft 34, and a rotational driving unit 35 (see FIG. 4).

The spin chuck 33 is configured to support the wafer W horizontally by attracting the central region of the rear surface Wb of the wafer W. By way of example, the spin chuck 33 may be configured to attract the wafer W by a negative pressure. The shaft 34 is connected to a bottom portion of the spin chuck 33 to extend in the vertical direction. The rotational driving unit 35 is configured to rotate the spin chuck 33 with the shaft 34 therebetween. The rotational driving unit 35 includes, by way of example, a rotational actuator. The rotational driving unit 35 rotates the spin chuck 33 around a vertical axis Ax0. As the spin chuck 33 is rotated by the rotational driving unit 35, the wafer W held by the spin chuck 33 is rotated around the axis Ax0.

The periphery holder 32 is configured to hold the peripheral region of the rear surface Wb of the wafer W when the center polishing of the wafer W is performed. The periphery holder 32 is equipped with, for example, two fixing chucks 36. The two fixing chucks 36 hold the wafer W horizontally by attracting the peripheral region of the rear surface Wb of the wafer W. By way of example, the fixing chucks 36 may be configured to attract the wafer W by a negative pressure. The two fixing chucks 36 are disposed with the spin chuck 33 therebetween in the left-right direction.

Figure 4:
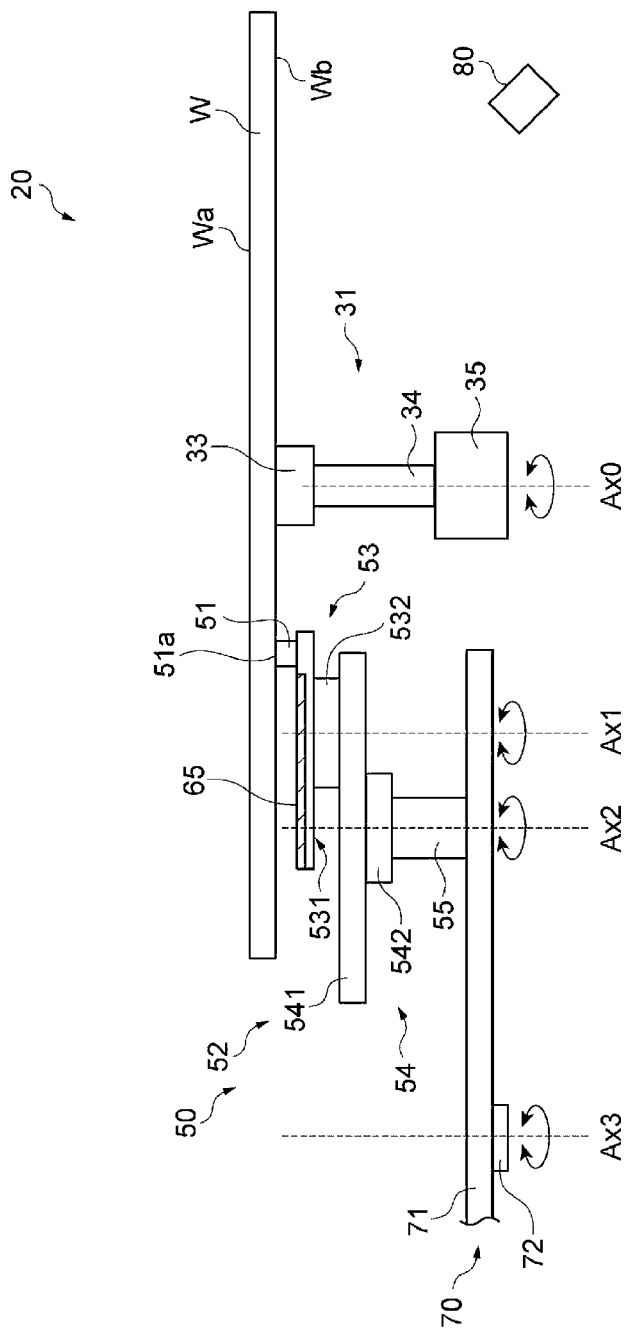
FIG. 4 is a side view schematically illustrating the example of the polishing unit.

The switching unit 40 is configured to switch a placement state of the wafer W. To elaborate, the switching unit 40 switches the placement state of the wafer W between a state in which the wafer W is placed to be subjected to the center polishing and a state where the wafer W is placed to be subjected to the periphery polishing. In the present exemplary embodiment, the switching unit 40 moves the periphery holder 32 to switch the placement state of the wafer W. The switching unit 40 changes a position of the periphery holder 32 between a position where the center polishing of the wafer W is performed and a position where the periphery polishing of the wafer W is performed. Further, FIG. 3 and FIG. 4 illustrate placement states of the individual components when the periphery polishing of the wafer W is performed. The switching unit 40 includes a horizontal driving unit 41 and an elevational driving unit 42.

The horizontal driving unit 41 is configured to move the fixing chuck 36 in the forward-backward direction. By way of example, the horizontal driving unit 41 includes a linear actuator. By moving the fixing chuck 36, the horizontal driving unit 41 moves the wafer W supported at the fixing chuck 36 in the forward-backward direction.

The elevational driving unit 42 is configured to move the fixing chuck 36 up and down. For example, the elevational driving unit 42 includes an elevational actuator. The elevational driving unit 42 moves the fixing chuck 36 up and down between a height position lower than the spin chuck 33 and a height position higher than the spin chuck 33. When the fixing chuck 36 is located higher than the spin chuck 33 by the elevational driving unit 42, the fixing chuck 36 holds the wafer W thereon. When the fixing chuck 36 is located lower than the spin chuck 33 by the elevational driving unit 42, the spin chuck 33 holds the wafer W thereon.

The polishing unit 50 is configured to roughen the rear surface Wb of the wafer W. To be specific, the polishing unit 50 polishes the rear surface Wb of the wafer W held by the substrate holder 30. The polishing unit 50 is equipped with, as depicted in FIG. 4, a polishing member 51 and a driving device 52.

The polishing member 51 is configured to polish the rear surface Wb of the wafer W by being slid on the rear surface Wb. The polishing member 51 is formed to have, for example, a cylindrical shape or a columnar shape. The polishing member 51 has a polishing surface 51a which comes into contact with the rear surface Wb of the wafer W when the rear surface Wb is polished. The polishing surface 51a forms, for example, a top surface of the polishing member 51. The polishing member 51 may be disposed so that the polishing surface 51a is substantially horizontal.

An upper portion (hereinafter, referred to as "polishing head") of the polishing member 51 including the polishing surface 51a may be composed of a whetstone. By way of example, the polishing head may be a diamond whetstone. A diamond having a grain size of No. 60000 may be used as the diamond whetstone. The whetstone belonging to the polishing member 51 may be composed of fine abrasive grains, a binder for binding the abrasive grains and pores. When viewed from the top, the polishing surface 51a may be of a circular shape or a ring shape. As an example, an outer diameter of the polishing head may equal to 3% to 8% of a radius of the wafer W. For example, a minimum value of the outer diameter of the polishing head may be 5 mm, 6 mm or 8 mm, and a maximum value of the outer diameter of the polishing head may be 10 mm, 11 mm or 12 mm.

The driving device 52 is configured to move the polishing member 51 in any one direction on a horizontal plane. The driving device 52 includes, by way of example, a rotating device 53, a rotating device 54 and an elevational driving unit 55. As illustrated in FIG. 4, the polishing member 51, the rotating device 53, the rotating device 54 and the elevational driving unit 55 may be arranged in this sequence from the top.

The rotating device 53 is configured to support and rotate the polishing member 51. To be specific, the rotating device 53 is configured to rotate the polishing member 51 around a vertical axis Ax1 (first axis). The rotating device 53 is equipped with a rotary stage 531 and a rotational driving unit 532 (first driving unit).

The rotary stage 531 is configured to hold the polishing member 51. That is, the rotary stage 531 serves as a holding member configured to hold the polishing member 51. The rotary stage 531 may be of a circulate plate shape. As shown in FIG. 3, a center position of the rotary stage 531 having the circular plate shape may be deviated from the axis Ax1. The rotary stage 531 has a surface (hereinafter, sometimes referred to as "holding surface 533") holding the polishing member 51 (see FIG. 5A). A diameter of the rotary stage 531 is larger than the outer diameter of the polishing member 51. That is, when viewed from the top, an area of the rotary stage 531 is larger than an area of the polishing member 51 (to be more specific, an area of a region surrounded by the outline of the polishing head).

The polishing member 51 is provided on the holding surface 533 of the rotary stage 531 such that a center position of the polishing member 51 does not lie on the axis Ax1. That is, the center position of the polishing member 51 is deviated from the axis Ax1. By way of example, the polishing member 51 may be provided at a position on the holding surface 533 of the rotary stage 531 near a periphery thereof.

The rotational driving unit 532 is configured to rotate the rotary stage 531 around the axis Ax1. The rotational driving unit 532 is connected to a rear surface of the rotary stage 531 opposite from the holding surface 533. By way of example, the rotational driving unit 532 includes a rotational actuator. As the rotary stage 531 is rotated by the rotational driving unit 532, the polishing member 51 is rotated around the axis Ax1.

The outer diameter of the polishing member 51 is smaller than a diameter of a movement range of the polishing member 51 around the axis Ax1. The movement range of the polishing member 51 around the axis Ax1 is a range where at least a part of the polishing surface 51a of the polishing member 51 can reach by being driven by the rotating device 53. That is, the outer diameter of the polishing member 51 is smaller than a diameter of an outline of a trajectory of the polishing member 51 by the rotating device 53.

The rotating device 54 is configured to move the axis Ax1 along a circular orbit around an axis Ax1 (second axis) which is parallel to the axis Ax1. By way of example, the rotating device 54 is configured to support the rotating device 53 including the rotary stage 531 which is rotated around the axis Ax1, and rotates the rotating device 53 around the axis Ax2. As the rotary stage 531 is rotated around the axis Ax2 by the rotating device 54, the polishing member 51 is moved along a circular orbit around the axis Ax2 while being rotated by the rotating device 53. If the rotating device 54 is driven in the state that the rotation of the polishing member 51 by the rotating device 53 is stopped, the polishing member 51 is rotated (revolved) along a circumference around the axis Ax2. The rotating device 54 includes a rotary stage 541 and a rotational driving unit 542 (second driving unit).

The rotary stage 541 is configured to support the rotating device 53 (rotational driving unit 532). The rotary stage 541 may be of a circular plate shape. A center position of the rotary stage 541 having the circular plate shape may substantially coincide with the axis Ax2. When viewed from the top, an area of the rotary stage 541 may be larger than the area of the rotary stage 531 of the rotating device 53. The rotary stage 541 is disposed such that a surface (supporting surface) thereof supporting the rotating device 53 is horizontal.

The rotational driving unit 542 is configured to rotate the rotary stage 541 around the axis Ax2. The rotational driving unit 542 is connected to a rear surface of the rotary stage 541 opposite from the supporting surface thereof. By way of example, the rotational driving device 542 includes a rotational actuator. As the rotary stage 541 is rotated by the rotational driving unit 542, the axis Ax1 is moved along a circular orbit around the axis Ax2.

The elevational driving unit 55 is configured to move the rotating devices 53 and 54 up and down. The elevational driving unit 55 supports the rotating device 54. The elevational driving unit 55 includes, by way of example, an elevational actuator. As the rotating devices 53 and 54 are moved up and down by the elevational driving unit 55, the polishing member 51 supported by the rotating device 53 is moved up and down. That is, a height position of the polishing surface 51a of the polishing member 51 is changed as the rotating devices 53 and 54 are moved up and down by the elevational driving unit 55.

Figure 5A:
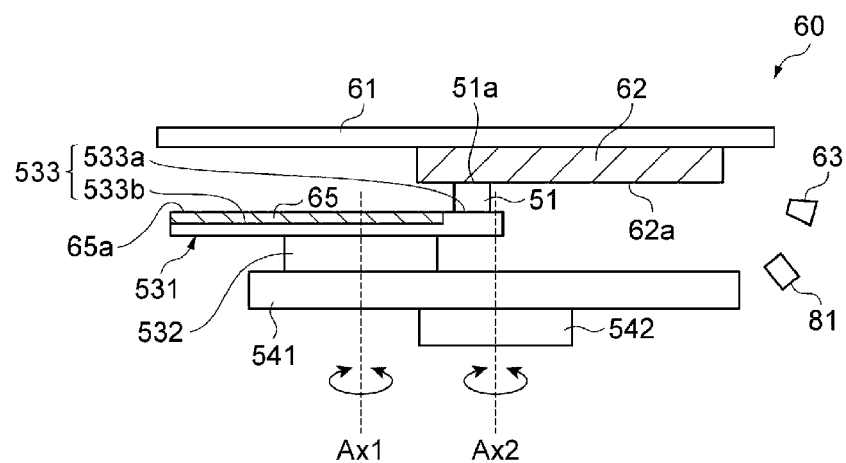
FIG. 5A and FIG. 5B are schematic diagrams for describing a dressing of a polishing member.

The dressing unit 60 is configured to perform a dressing of (upon) the polishing surface 51a of the polishing member 51. The dressing unit 60 performs sharpening whereby the abrasive grains forming the polishing surface 51a are protruded (exposed) from the polishing surface 51a. As the sharpening of the polishing surface 51a is performed by the dressing unit 60, polishing accuracy (state) is maintained even if the polishing surface 51a is abraded due to the polishing of the wafer W. As shown in FIG. 3, the dressing unit 60 is provided, within the housing 21, at a position (hereinafter, referred to as "dressing position") different from a polishing position where the polishing of the rear surface Wb of the wafer W is performed. The dressing unit 60 may be fixed to a preset position of the housing 21. The dressing unit 60 includes, as depicted in FIG. 5A, a ceiling plate member 61, a dressing member 62 (first dressing member) and a nozzle 63.

The ceiling plate member 61 is a plate-shaped member supporting the dressing member 62. The ceiling plate member 61 extends along the horizontal direction. The ceiling plate member 61 is disposed higher than, for example, the rotary stages 531 and 541. The ceiling plate member 61 has a size as large as to cover the rotary stage 541, when viewed from the top, for example. The shape of the ceiling plate member 61 shown in FIG. 5A is just an example, and the size and the layout thereof may be appropriately modified.

The dressing member 62 is a member for performing the dressing of the polishing surface 51a. The dressing member 62 is provided at a bottom surface of the ceiling plate member 61. Further, the dressing member 62 may be fixed to the ceiling plate member 61 with a non-illustrated fixing member therebetween. Furthermore, the dressing member 62 may be fixed at a preset position within the housing 21. A size of the dressing member 62 may be smaller than the size of the ceiling plate member 61 when viewed from the top, for example.

The dressing member 62 has a dressing surface 62a (first dressing surface) configured to perform the dressing of the polishing surface 51a. For example, a bottom surface of the dressing member 62 serves as the dressing surface 62a. The dressing surface 62a may face the holding surface 533 of the rotary stage 531. Further, the dressing surface 62a may face the polishing surface 51a. By way of example, the dressing surface 62a and the polishing surface 51a may be substantially parallel to each other. Further, in the present exemplary embodiment, a layout where one member (one surface) faces the other (the other surface) includes a layout where the one member and the other are not overlapped with each other when viewed from the top as well as a layout where the one member and the other are overlapped with each other.

The dressing member 62 may be made of, by way of non-limiting example, a carbon-containing metal or ceramics such as alumina. At least a portion of the dressing member 62 including the dressing surface 62a needs to be made of the carbon-containing metal or the ceramics. Further, a hardness of the dressing member 62 may be lower than a hardness of the polishing member 51. To be more specific, a hardness of the portion of the dressing member 62 including the dressing surface 62a may be lower than a hardness of the portion (polishing head) of the polishing member 51 including the polishing surface 51a. Here, the hardness is defined by, for example, Vickers hardness.

The nozzle 63 is configured to supply a rinse liquid to the dressing surface 62a of the dressing member 62. The nozzle 63 may be disposed diagonally below the dressing member 62, as depicted in FIG. 5A. The nozzle 63 is connected to a non-illustrated liquid source and discharges the rinse liquid toward the dressing surface 62a when the polishing of the polishing surface 51a by the dressing member 62 is performed.

Figure 5B:
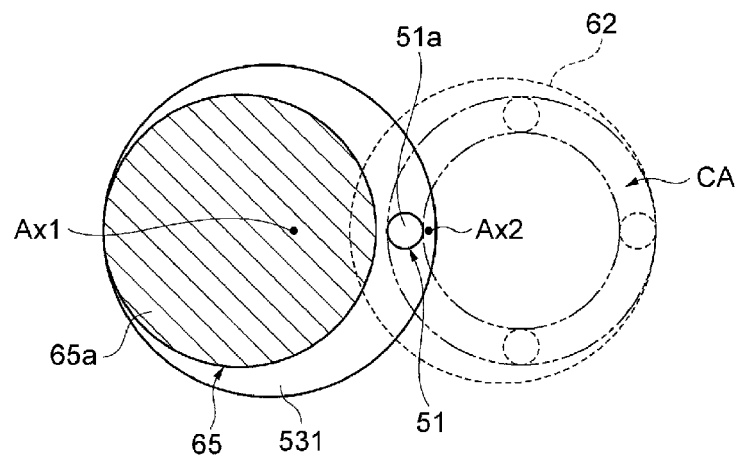

When the dressing of the polishing surface 51a is performed at the dressing position, the polishing member 51 is placed so that the polishing surface 51a is in contact with the dressing surface 62a, as shown in FIG. 5A. Further, the placement into this contact state is achieved as the control device 100 controls the individual driving units belonging to the driving device 52. As the driving device 52 moves the polishing member 51 (rotary stage 531) in the horizontal direction with respect to the dressing surface 62a in the state that the polishing surface 51a is in contact with the dressing surface 62a, the dressing of the polishing surface 51a is carried out. As depicted in FIG. 5B, when the dressing of the polishing surface 51a is performed, a contact area CA which comes into contact with the polishing surface 51a is formed at a part of the dressing surface 62a. A dressing sequence for the polishing surface 51a will be elaborated later.

The polishing unit 50 is further equipped with an auxiliary dressing member 65 (second dressing member) configured to perform a dressing of the dressing surface 62a (dressing upon the dressing surface 62a). The auxiliary dressing member 65 may be formed to have a plate shape, as shown in FIG. 5A and FIG. 5B. The auxiliary dressing member 65 may be provided on the holding surface 533 of the rotary stage 531. That is, both the polishing member 51 and the auxiliary dressing member 65 are fixed on the single surface (holding surface 533). In the example shown in FIG. 5A, the holding surface 533 includes a holding surface 533a and a holding surface 533b having different height positions. The holding surface 533a may be provided at a position higher than the holding surface 533b.

The polishing member 51 may be provided on the holding surface 533a. The auxiliary dressing member 65 may be provided on the holding surface 533b. The auxiliary dressing member 65 has a dressing surface (hereinafter, referred to as "auxiliary dressing surface 65a") configured to perform a dressing upon the dressing surface 62a of the dressing member 62. The auxiliary dressing surface 65a (second dressing surface) forms a top surface of the auxiliary dressing member 65. The auxiliary dressing surface 65a may be disposed at a height position substantially on a level with the holding surface 533a. That is, a difference between the height positions of the holding surface 533a and the holding surface 533b may be substantially equal to a thickness (length in the vertical direction) of the auxiliary dressing member 65. In this way, the height position of the polishing surface 51a may be higher than the height position of the auxiliary dressing surface 65a. Further, the height positions of the holding surface 533a and the holding surface 533b may be substantially same so that a single plane is formed by the holding surface 533a and the holding surface 533b.

As depicted in FIG. 5B, when viewed from the top, an area of the auxiliary dressing member 65 (auxiliary dressing surface 65a) is smaller than that of the rotary stage 531 and larger than that of the polishing member 51. When viewed from the top, the auxiliary dressing member 65 may occupy the most of the rotary stage 531. By way of example, when viewed from the top, the size of the auxiliary dressing surface 65a may be 5 times to 20 times as larger as the size of the polishing member 51. The auxiliary dressing surface 65a may face the dressing surface 62a. By way of example, the auxiliary dressing surface 65a and the dressing surface 62a may be substantially parallel to each other. As stated above, the dressing surface 62a of the dressing member 62 may be configured to face both the auxiliary dressing surface 65a and the polishing surface 51a.

The auxiliary dressing member 65 may be made of, by way of non-limiting example, a carbon-containing metal or ceramics such as alumina. At least a portion of the auxiliary dressing member 65 including the auxiliary dressing surface 65a may be made of the carbon-containing metal or the ceramics. Further, a hardness of the auxiliary dressing member 65 may be lower than a hardness of the dressing member 62. To be more specific, a hardness of the portion of the auxiliary dressing member 65 including the auxiliary dressing surface 65a may be lower than the hardness of the portion of the dressing member 62 including the dressing surface 62a. The dressing member 62 and the auxiliary dressing member 65 may be made of the same material or different materials. By way of example, if these members are made of the same material, the aforementioned relationship regarding the hardness thereof is satisfied by setting a grain size (whetstone No.) of the auxiliary dressing member 65 to be smaller than a grain size (whetstone No.) of the dressing member 62. The hardness of the auxiliary dressing member 65, the hardness of the dressing member 62 and the hardness of the polishing member 51 may be lower in this sequence.

Figure 6A:
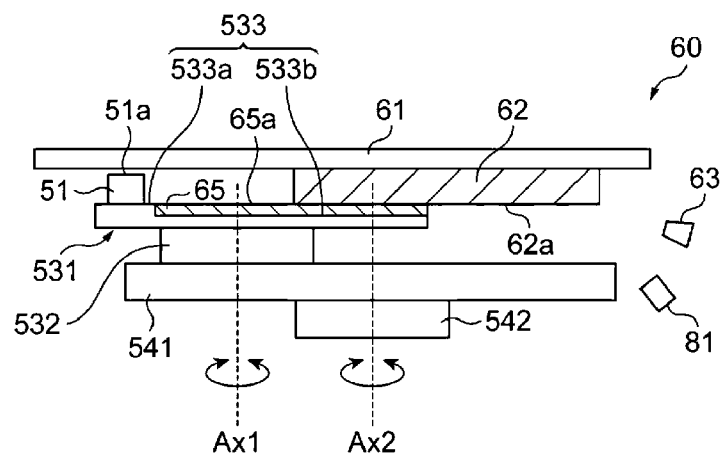
FIG. 6A and FIG. 6B are schematic diagrams illustrating a dressing of a first dressing member.
Figure 6B:
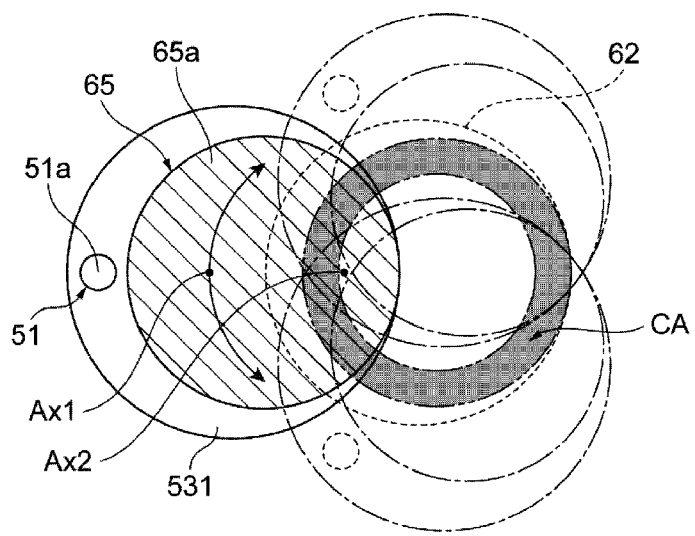

When the dressing of the dressing surface 62a of the dressing member 62 is performed at the dressing position, the auxiliary dressing member 65 is placed such that the auxiliary dressing surface 65a is in contact with the dressing surface 62a, as shown in FIG. 6A. Further, the placement into this contact state is achieved as the control device 100 controls the individual driving units belonging to the driving device 52. As the individual driving units of the driving device 52 move the auxiliary dressing member 65 (rotary stage 531) with respect to the dressing surface 62a in the state that the auxiliary dressing surface 65a is in contact with the dressing surface 62a, the dressing of the dressing surface 62a is performed. As shown in FIG. 6B, when the dressing of the dressing surface 62a is performed, the contact position of the auxiliary dressing surface 65a upon the dressing surface 62a is moved to cover the contact area CA within the dressing surface 62a which has been in contact with the polishing surface 51a. A dressing sequence for the dressing surface 62a will be described later.

Some components belonging to the driving device 52 perform, at the dressing position, a switchover between a state (hereinafter, referred to as "first state") in which the dressing of the polishing surface 51a is performed and a state (hereinafter, referred to as "second state") in which the dressing of the dressing surface 62a is performed. Since both the polishing member 51 and the auxiliary dressing member 65 are provided on the rotary stage 531, a relative position between the polishing member 51 and the dressing member 62 and a relative position between the auxiliary dressing member 65 and the dressing member 62 are changed as the rotary stage 531 is moved. Therefore, the rotational driving units 532 and 542 and the elevational driving unit 55 belonging to the driving device 52 are capable of switching the first state and the second state by moving the rotary stage 531 based on an operational instruction from the control device 100.

In the example shown in FIG. 5A and FIG. 6A, the first state and the second state are switched as the rotational driving unit 532 changes the positions of the polishing surface 51a and the auxiliary dressing surface 65a when viewed from the top and, also, as the elevational driving unit 55 changes the distance between the rotary stage 531 and the dressing member 62. In this example, the rotational driving units 532 and 542 and the elevational driving unit 55 constitute a driving unit.

Referring back to FIG. 3 and FIG. 4, the revolving unit 70 moves the polishing unit 50 between the polishing position and the dressing position. The revolving unit 70 is configured to move the polishing unit 50 along a circular orbit around an axis Ax3 which is parallel to the axis Ax1 (axis Ax2). The revolving unit 70 is equipped with a revolving stage 71 and a revolution driving unit 72.

The revolving stage 71 is configured to support the polishing unit 50 (elevational driving unit 55). The revolving stage 71 may be of a plate shape. When viewed from the top, an area of the revolving stage 71 may be larger than the area of the rotational stage 541 of the rotating device 54. The revolving stage 71 is disposed such that a surface thereof (hereinafter, referred to as "supporting surface") supporting the elevational driving unit 55 is horizontal.

The revolution driving unit 72 is configured to rotate the revolving stage 71 around the axis Ax3. The revolution driving unit 72 is connected to a rear surface (bottom surface) of the revolving stage 71 opposite from the supporting surface thereof. The revolution driving unit 72 includes, by way of example, a rotational actuator. As the revolving stage 71 is moved along a circumference around the axis Ax3 by the revolution driving unit 72, the polishing unit 50 is moved along this circumference between the polishing position and the dressing position.

The inspecting unit 80 is configured to acquire surface information which indicates surface states of individual portions of the polished wafer W. For example, the inspecting unit 80 acquires polishing information indicating a polished state of the rear surface Wb of the wafer W as the surface information, and outputs this polishing information to the control device 100. The inspecting unit 80 may be, for example, a camera, and may acquire image data of, for example, the rear surface Wb of the wafer W as the polishing information by imaging the rear surface Wb after the polishing upon the rear surface Wb of the wafer W is performed. Further, the inspecting unit 80 may include, instead of the camera, a light source configured to irradiate light having a preset wavelength to the rear surface Wb; and a detector configured to detect light reflected from the rear surface Wb. In this case, information upon intensity of the reflected light or the like may be used as the polishing information, instead of the image data of the rear surface Wb.

<Control Device>

Figure 7:
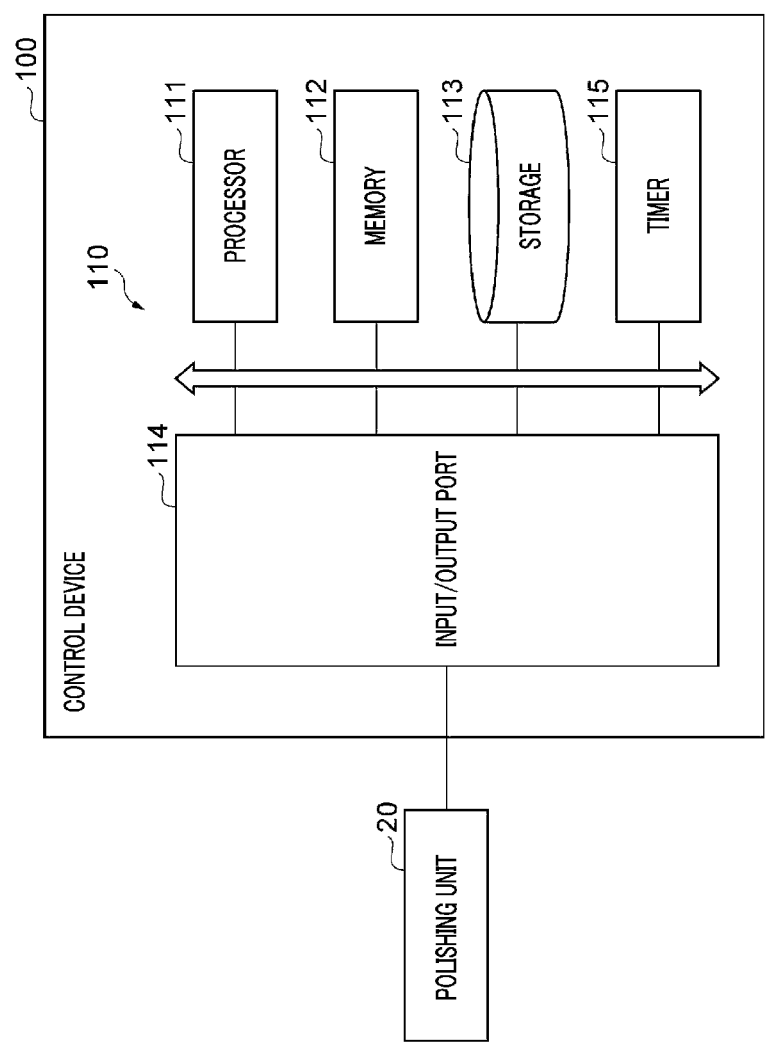
FIG. 7 is a block diagram illustrating an example of a hardware configuration of a control device.

Now, referring to FIG. 7, an example of a hardware configuration of the control device 100 will be explained. The control device 100 is composed of, by way of example, one or more control computers. For example, the control device 100 has a circuit 110 shown in FIG. 7. The circuit 110 is equipped with one or more processors 111, a memory 112, a storage 113, an input/output port 114 and a timer 115.

The storage 113 has a computer-readable recording medium such as, but not limited, a hard disk. The recording medium stores thereon programs that cause the control device 100 to carry out a polishing sequence to be described later. The recording medium may be a portable medium such as, by way of example, a nonvolatile semiconductor memory, a magnetic disk or an optical disk. The memory 112 temporarily stores thereon the programs loaded from the recording medium of the storage 113 and an operation result by the processor 111. The processor 111 constitutes the aforementioned individual functional modules by executing the programs in cooperation with the memory 112. The timer 115 measures an elapsed time by, for example, counting a reference pulse of a preset cycle. The input/output port 114 is configured to perform an input/output of an electric signal to/from a control target or a member as a target of information acquisition belonging to the polishing unit 20 in response to an instruction from the storage 113.

Further, the hardware configuration of the control device 100 is not limited to constituting the individual functional modules by the programs. For example, each functional module of the control device 100 may be implemented by a dedicated logical circuit or an ASIC (Application Specific Integrated Circuit) which is an integration of logical circuits.

[Polishing Sequence]

Figure 8:
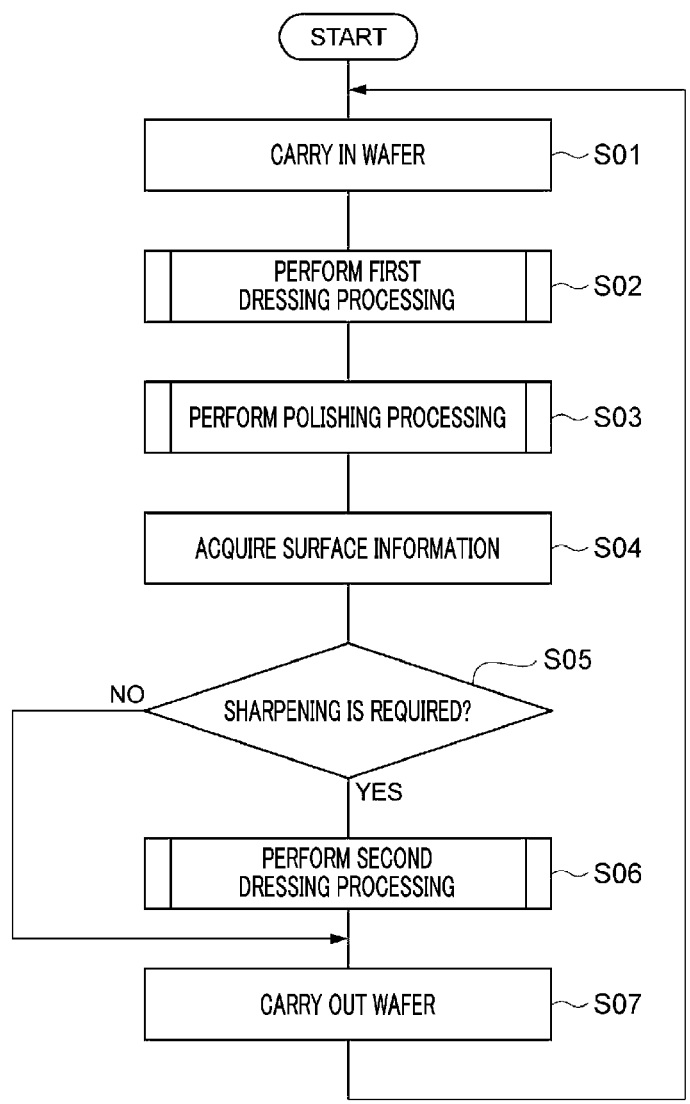
FIG. 8 is a flowchart illustrating an example of a processing sequence in the polishing unit.

Now, referring to FIG. 8, a polishing sequence performed by using the polishing unit 20 will be explained as an example of a substrate processing method. FIG. 8 is a flowchart illustrating an example of the polishing sequence performed on each of a plurality of wafers W in sequence.

First, the control device 100 performs a process S01. In the process S01, the control device 100 controls the transfer device A8 to carry the wafer W as the processing target into the polishing unit 20. At this time, the transfer device A8 may deliver the wafer W as the processing target onto the rotary holder 31 of the substrate holder 30.

Then, the control device 100 performs a process S02. In the process S02, the control device 100 performs a first dressing processing. To elaborate, the control device 100 allows the dressing of the polishing surface 51a of the polishing member 51 to be performed by the dressing member 62 (dressing surface 62a) of the dressing unit 60 in the state that the polishing unit 50 is placed at the dressing position. A specific example of this first dressing processing will be elaborated later.

Subsequently, the control device 100 performs a process S03. In the process S03, the control device 100 performs a polishing processing. To be specific, the control device 100 controls the polishing member 51 to polish the rear surface Wb of the wafer W in the state that the polishing unit 50 is placed at the polishing position. A specific example of this polishing processing will be described later.

Thereafter, the control device 100 performs a process S04. In the process S04, the control device 100 acquires the surface information. By way of example, as the surface information, the control device 100 may acquire, from the inspecting unit 80, the polishing information (for example, image data) indicating the polished state of the rear surface Wb of the wafer W upon which the polishing processing is performed in the process S03.

Next, the control device 100 performs a process S05. In the process S05, the control device 100 determines, based on the surface information (here, the polishing information) obtained in the process S04, whether or not the sharpening of the dressing surface 62a of the dressing member 62 is required. That is, the control device 100 determines whether or not to perform the dressing of the dressing surface 62a of the dressing member 62 based on the polishing information. For example, the control device 100 may store therein image data for comparison which reflects an appropriate polished state in advance, and, by comparing the polishing information and the image data for comparison, the control device 100 may determine whether the sharpening of the dressing surface 62a is necessary.

If it is determined in the process S05 that the sharpening of the dressing surface 62a is necessary (process S05: YES), the control device 100 performs a process S06. In the process S06, the control device 100 carries out a second dressing processing. To be specific, the control device 100 controls the auxiliary dressing member 65 (auxiliary dressing surface 65a) to perform the dressing of the dressing surface 62a of the dressing member 62 in the state that the polishing unit 50 is placed at the dressing position. A specific example of this second dressing processing will be elaborated later. Meanwhile, if it is determined in the process S05 that the sharpening of the dressing surface 62a is not necessary, the control device 100 does not perform the process S06.

Subsequently, the control device 100 performs a process S07. In the process S07, the control device 100 controls the transfer device A8 to carry out the wafer W as the processing target from the polishing unit 20. Accordingly, a series of processes of the polishing sequence upon the single sheet of wafer W is completed, and the control device 100 repeats the processes S01 to S07 for each of the plurality of wafers W as the processing targets.

<Dressing Processing for Polishing Surface>

Figure 9:
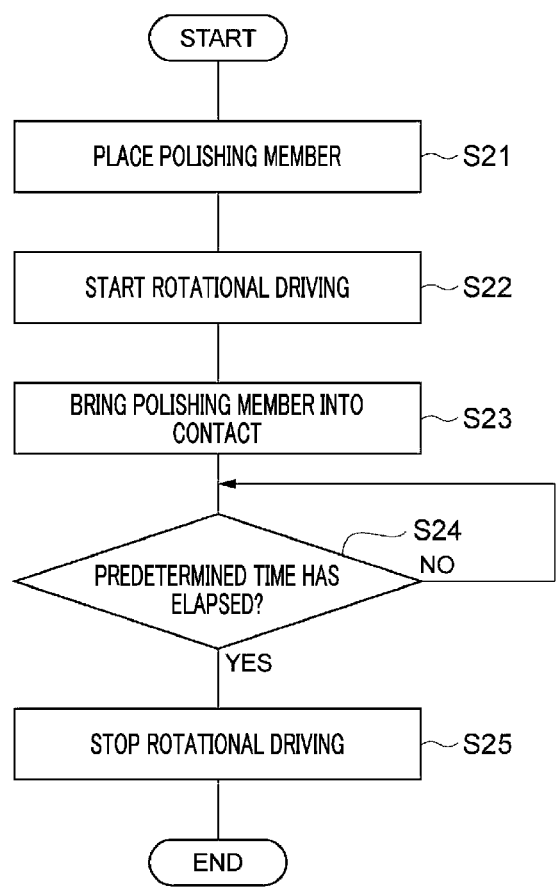
FIG. 9 is a flowchart illustrating an example of a first dressing processing for the polishing member.

Now, referring to FIG. 9, a specific example of the first dressing processing in the process S02 will be described. FIG. 9 is a flowchart illustrating an example of the first dressing processing for the polishing member 51.

In the first dressing processing, the control device 100 first performs a process S21. In the process S21, the control device 100 controls the driving device 52 for the polishing unit 50 located at the dressing position, and places the polishing member 51 at the position where the dressing of the polishing surface 51a is performed. By way of example, by controlling the rotational driving unit 532, the control device 100 moves the rotary stage 531 such that the polishing surface 51a and the dressing surface 62a are overlapped when viewed from the top, as shown in FIG. 5A.

Then, the control device 100 performs a process S22. In the process S22, the control device 100 begins rotational driving of the polishing member 51. The control device 100 controls the rotational driving units 532 and 542 to allow the polishing member 51 to be moved within the dressing member 62 (dressing surface 62a), when viewed from the top, for example. As an example, the control device 100 may control the rotational driving units 532 and 542 such that the rotary stage 531 is rotated around the axis Ax1 while the positions of the polishing member 51 and the auxiliary dressing member 65 on the rotary stage 531 are maintained. Accordingly, as illustrated in FIG. 5B, the polishing member 51 is moved along a circular orbit having the substantially same radius as a distance between the axis Ax1 and the axis Ax1. Further, in FIG. 5B, a path (a trajectory of the contact position) along which the polishing member 51 is moved is marked as the contact area CA. In the example shown in FIG. 5B, the contact area CA is of an annular shape. The path along which the polishing member 51 is moved may be appropriately changed depending on the control method for the rotational driving units 532 and 542.

Thereafter, the control device 100 performs a process S23. In the process S23, while carrying on the rotational driving which is begun in the process S22, the control device 100 controls the elevational driving unit 55 to move the rotary stage 531 upwards, thus allowing the polishing surface 51a to be brought into contact with the dressing surface 62a. Accordingly, the dressing of the polishing surface 51a by the dressing surface 62a is begun.

Subsequently, the control device 100 performs a process S24. In the process S24, the control device 100 stands by until a predetermined time elapses from a time when the polishing surface 51a comes into contact with the dressing surface 62a. Accordingly, during this predetermined time, as shown in FIG. 5B, the polishing surface 51a is moved along the dressing surface 62a while being in contact with the dressing surface 62a, so that the polishing surface 51a is sharpened by the dressing surface 62a. In this case, as the polishing member 51 is moved along the aforementioned circular orbit when the dressing of the polishing surface 51a is carried out, a portion of the polishing member 51 that proceeds along the circular orbit is not always the same position on the outer edge of the polishing member 51. Thus, non-uniformity in the dressing upon the polishing member 51 is suppressed.

Upon the lapse of the predetermined time, the control device 100 performs a process S25. In the process S25, the control device 100 stops the rotational driving by controlling the rotational driving units 532 and 542. Further, the control device 100 may control the elevational driving unit 55 to move the rotary stage 531 downwards before or after the stop of the rotational driving. Accordingly, the first dressing processing which is performed upon each single sheet of wafer W as the processing target is completed.

<Polishing Processing>

Figure 10:
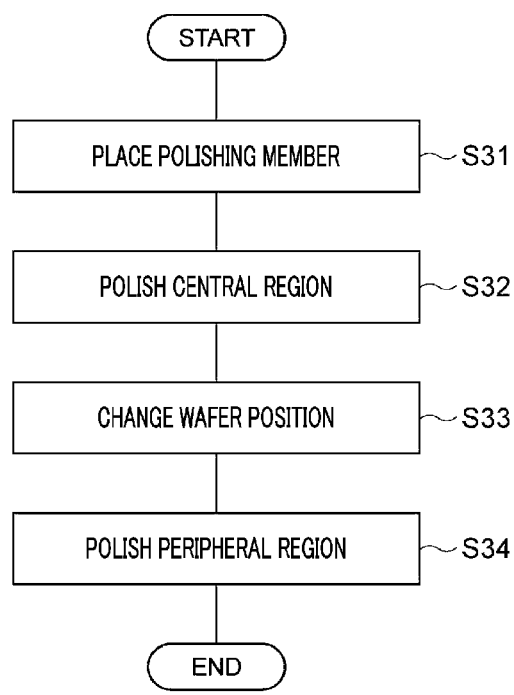
FIG. 10 is a flowchart illustrating an example of a polishing processing.

Now, referring to FIG. 10, a specific example of the polishing processing in the process S03 will be described. FIG. 10 is a flowchart illustrating an example of the polishing processing.

First, the control device 100 performs a process S31. In the process S31, the control device 100 first controls the switching unit 40 to place the wafer W at the position where the center polishing is performed. By way of example, the control device 100 holds the wafer W, which is held by the substrate holder 30, on the fixing chucks 36, and moves the fixing chucks 36 to a position where the central region of the wafer W is spaced apart from the spin chuck 33. Then, the control device 100 moves the polishing unit 50 from the dressing position to the polishing position by controlling the revolution driving unit 72. Thereafter, by controlling the rotational driving unit 542, the control device 100 places the polishing member 51 so that the rotary stage 531 is overlapped with the central region of the rear surface Wb of the wafer W.

Subsequently, the control device 100 performs a process S32. In the process S32, the control device 100 controls the driving device 52 to polish the central region of the rear surface Wb of the wafer W. By way of example, while rotating the rotary stage 531 (polishing member 51) around the axis Ax1 by the rotational driving unit 532, the control device 100 controls the elevational driving unit 55 to bring the polishing surface 51a into contact with the rear surface Wb of the wafer W. At this time, the control device 100 may stop the rotational driving by the rotational driving unit 542. The control device 100 carries out the polishing of the central region for a preset time.

Then, the control device 100 performs a process S33. In the process S33, the control device 100 controls the switching unit 40 to move the wafer W from the position where the center polishing is performed to the position where the periphery polishing is performed. By way of example, the control device 100 moves the fixing chucks 36 holding the wafer W to a position where a center portion of the wafer W is overlapped with the spin chuck 33. Then, the control device 100 places the wafer W on the spin chuck 33.

Next, the control device 100 performs a process S34. In the process S34, by controlling the substrate holder 30 and the driving device 52, the control device 100 allows the periphery region of the rear surface Wb of the wafer W to be polished. By way of example, while rotating the wafer W around the axis Ax0 by the rotational driving unit 35, the control device 100 may move the polishing member 51 along the radial direction of the wafer W in the state that the polishing member 51 is in contact with the rear surface Wb of the wafer W. As an example, by controlling the rotational driving units 532 and 542, the control device 100 may polish the periphery region of the wafer W by moving the polishing member 51 from the central region of the wafer W to an outside of the wafer W, while carrying out the rotation and revolution of the rotary stage 531. Through these processes, the polishing processing upon the single sheet of wafer W as the processing target is completed.

<Dressing Processing for Dressing Surface>

Figure 11:
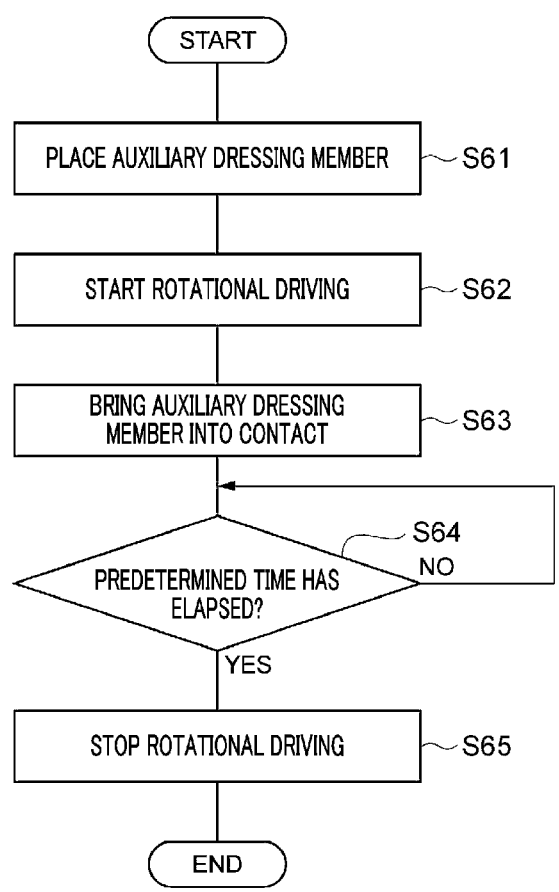
FIG. 11 is a flowchart illustrating an example of a second dressing processing for a dressing member.

Now, referring to FIG. 11, a specific example of the second dressing processing in the process S06 will be elaborated. FIG. 11 is a flowchart illustrating an example of the second dressing processing upon the dressing member 62.

First, the control device 100 performs a process S61. In the process S61, the control device 100 places the auxiliary dressing member 65 at the position where the dressing of the dressing surface 62a is performed. By way of example, the control device 100 moves the polishing unit 50 to the dressing position by first controlling the revolution driving unit 72. Then, the control device 100 controls the rotational driving unit 532 (rotates the rotatory stage 531) so that the auxiliary dressing surface 65a is overlapped with the dressing surface 62a, when viewed from the top, as illustrated in FIG. 6A.

Then, the control device 100 performs a process S62. In the process S62, the control device 100 begins the rotational driving. The control device 100 may control at least one of the rotational driving units 532 and 542 so that the moved auxiliary dressing surface 65a covers the entire contact area CA, when viewed from the top, for example. At this time, the control device 100 may control at least one of the rotational driving units 532 and 542 so that the polishing member 51 and the dressing member 62 are not overlapped with each other when viewed from the top and so that the auxiliary dressing surface 65a covers the entire contact area CA. The control device 100 may control at least one of the rotational driving units 532 and 542 such that the polishing member 51 and the dressing member 62 do not interfere with each other and the auxiliary dressing surface 65a covers the entire dressing surface 62a.

As an example, as depicted in FIG. 6B, the control device 100 may control the rotational driving units 532 and 542 such that the rotary stage 531 is reciprocated on a part of the rotational trajectory around the axis Ax2 while the rotary stage 531 is rotated such that the polishing member 51 does not interfere with the dressing member 62. The operation of the auxiliary dressing member 65 may be appropriately changed depending on the control method for the rotational driving units 532 and 542. By way of example, the control device 100 may control the rotational driving units 532 and 542 to reciprocate the rotary stage 531 on the part of the rotational trajectory around the axis Ax2 while the positions of the polishing member 51 and the auxiliary dressing member 65 on the rotary stage 531 are maintained.

Afterwards, the control device 100 performs a process S63. In the process S63, while carrying on the rotational driving (reciprocating movements) which is begun in the process S62, the control device 100 controls the elevational driving unit 55 to move the rotary stage 531 upwards, thus bringing the auxiliary dressing surface 65a into contact with the dressing surface 62a. Accordingly, the dressing of the dressing surface 62a by the auxiliary dressing surface 65a is begun.

Thereafter, the control device 100 performs a process S64. In the process S64, the control device 100 stands by until a predetermine time elapses from a time when the auxiliary dressing surface 65*a* is brought into contact with the dressing surface 62*a*. By way of example, the predetermined time may be set such that the dressing surface 62*a* passes across the entire contact area CA multiple times. During the predetermined time, as shown in FIG. 6B, as the polishing member 51 and the dressing member 62 do not interfere with each other and the auxiliary dressing surface 65*a* is moved along the dressing surface 62*a* while being in contact with the dressing surface 62*a*, the sharpening of the dressing surface 62*a* by the auxiliary dressing surface 65*a* is carried out. Further, in the above-stated rotational driving (reciprocating movements), if the sharpening of the entire contact area CA by the auxiliary dressing surface 65*a* cannot be performed, a moving direction or the like may be changed to enable the sharpening of the entire contact area CA by the auxiliary dressing surface 65*a*.

Upon the lapse of the predetermined time, the control device 100 performs a process S65. In the process S65, the control device 100 stops the rotational driving by controlling the rotational driving unit 532 and 542. Further, the control device 100 may move the rotary stage 531 downwards by controlling the elevational driving unit 55 before or after the stopping of the rotational driving is performed. Through the above-described processes, the second dressing processing is completed.

The above-described substrate processing sequence using the polishing unit 20 includes performing the dressing of the polishing surface 51*a* by bringing the dressing surface 62*a* and the polishing surface 51*a* into contact with each other (process S02); performing the dressing of the dressing surface 62*a* by bringing the dressing surface 62*a* and the auxiliary dressing surface 65*a* into contact with each other (process S06); and switching, by moving the rotary stage 531, the first state in which the dressing of the polishing surface 51*a* is performed and the second state in which the dressing of the dressing surface 62*a* is performed (processes S21, S23, S61 and S63).

[Effects]

In the above-described exemplary embodiments, the dressing of the polishing surface 51*a* is performed in the first state, and the dressing of the dressing surface 62*a* is performed in the second state. Though the polishing upon the wafer W is carried out stably as the dressing of the polishing surface 51*a* is performed, the dressing surface 62*a* of the dressing member 62 is abraded. Since, however, the dressing of the dressing surface 62*a* is performed by the auxiliary dressing surface 65*a*, the abraded portion of the dressing surface 62*a* is sharpened. Therefore, the dressing of the polishing surface 51*a* is performed in the state that the abrasion state of the dressing surface 62*a* is improved. As a result, the stable polishing processing can be carried on.

It may be assumed that the polishing of the wafer W is carried on by performing the dressing of the polishing surface 51*a* with the dressing surface 62*a* without performing the dressing of the dressing surface 62*a*. In this case, the dressing of the polishing surface 51*a* is performed in the state that the dressing surface 62*a* of the dressing member 62 is abraded. For the reason, as a repetition number of the dressing upon the polishing surface 51*a* increases (for example, if the repetition number exceeds several tens of times), the sharpening of the polishing surface 51*a* may not be performed sufficiently, and the polishing may not be carried out sufficiently to obtain a required polishing result. That is, the polishing of the wafer W may not be performed appropriately, or a polishing time for carrying out the polishing of the wafer W appropriately may be lengthened. According to the exemplary embodiments, however, since the dressing of the polishing surface 51*a* is performed in the state that the abrasion state of the dressing surface 62*a* is improved, the polishing processing capable of achieving the required polishing result can be carried on.

It may be considered to replace the dressing member 62 with a new one to obtain the required polishing result for the wafer W. During this replacement, however, the processing by the polishing unit 20 (coating and developing apparatus 2) needs to be stopped. Even in the above-described configuration of the exemplary embodiments, the dressing surface 62*a* may not be sufficiently dressed due to the abrasion of the auxiliary dressing surface 65*a* of the auxiliary dressing member 65. However, as compared to a configuration in which the dressing of the dressing surface 62*a* is not performed, a period during which the sharpening of the polishing surface 51*a* by the dressing surface 62*a* can be performed sufficiently can be lengthened. Therefore, a throughput can be maintained and stabilization of the polishing processing can be achieved.

In the above-described exemplary embodiments, the auxiliary dressing member 65 and the polishing member 51 are fixed on the single holding surface 533 of the rotary stage 531. The height positions of the auxiliary dressing surface 65*a* and the polishing surface 51*a* are different. The driving unit belonging to the driving device 52 switches the first state and the second state by changing the positions of the auxiliary dressing surface 65*a* and the polishing surface 51*a* when viewed form the top and, also, by changing the distance between the rotary stage 531 and the dressing surface 62*a*. In this configuration, the auxiliary dressing member 65 for maintaining the good quality of the dressing surface 62*a* and the polishing member 51 for polishing the rear surface Wb of the wafer W are provided on the surface (holding surface 533) facing the dressing surface 62*a*. Accordingly, the stable polishing processing can be carried on without needing to scale up the polishing unit 20 which performs the polishing of the wafer W.

In the above-described exemplary embodiment, the hardness of the auxiliary dressing member 65 is lower than the hardness of the dressing member 62. In this case, since the member (dressing member 62) as the target of the dressing is stronger than the member (auxiliary dressing member 65) which performs the dressing, the sharpening of the dressing surface 62*a* of the dressing member 62 can be carried out more securely.

In the above-described configuration, the driving unit belonging to the driving device 52 moves the contact position of the auxiliary dressing surface 65*a* of the auxiliary dressing member 65 in the second state (second dressing processing) to cover the contact area CA of the dressing surface 62*a* which has been in contact with the polishing surface 51*a* when the dressing of the polishing surface 51*a* is performed in the first state (first dressing processing). The contact area CA of the dressing surface 62*a* is abraded as the dressing of the polishing surface 51*a* progresses. In the above-described configuration, since the dressing upon the dressing surface 62*a* is performed to cover the contact area CA which is abraded, the degree of the dressing of the polishing surface 51*a* by the dressing surface 62*a* can be stabilized more securely.

Further, the target of the dressing by the auxiliary dressing surface 65*a* may be set to be the contact area CA and a region around it so that a periphery of the contact area CA (that is, a boundary between the contact area CA and a region other than that) formed on the dressing surface 62a is included in the target of the dressing. By setting the contact area CA and the region around it as the target of the dressing, the dressing of the contact area CA can be carried out appropriately. Furthermore, the target of the dressing by the auxiliary dressing surface 65a may be set to be the contact area CA formed on the dressing surface 62a and the region around it, or the entire dressing surface 62a. In case that the entire dressing surface 62a is set as the target of the dressing, the entire dressing surface 62a including the contact area CA can be uniformly protruded. Therefore, uniform protrusion can be achieved in the dressing of the polishing surface 51a by the dressing surface 62a after the dressing of the dressing surface 62a.

In the above-described exemplary embodiment, the coating and developing apparatus 2 is equipped with the control device 100 configured to control the driving units belonging to the driving device 52. The driving device 52 includes the rotational driving unit 532 configured to rotate the rotary stage 531 to allow the polishing member 51 to be rotated around the axis Ax1; and the rotational driving unit 542 configured to move the rotary stage 531 to allow the axis Ax1 to be moved along the circular orbit around the axis Ax1 which is parallel to the axis Ax1. The control device 100 changes the positions of the polishing surface 51a and the auxiliary dressing surface 65a when viewed from the top by rotating the rotary stage 531 with the rotational driving unit 532. The control device 100 moves the contact position of the auxiliary dressing surface 65a with respect to the contact area CA by moving the rotary stage 531 with the rotational driving unit 542 in the second state (second dressing processing).

In this case, the auxiliary dressing surface 65a can be moved in a wide range through the operation of the rotary stage 531 which is driven by the rotational driving unit 542. Thus, when the dressing of the dressing surface 62a is performed, it is easy to cover the contact area CA. Further, the rotational driving unit 542 is used for the polishing processing upon the rear surface Wb (more specifically, the periphery region) of the wafer W. That is, stabilization of the dressing of the polishing surface 51a by allowing the contact position of the auxiliary dressing surface 65a to cover the contact area CA can be achieved without needing to scale up the polishing unit 20.

In the above-described exemplary embodiment, the coating and developing apparatus 2 is equipped with the control device 100 configured to acquire the polishing information indicating the polished state of the rear surface Wb of the wafer W after being polished by the polishing member 51. The control device 100 decides whether to perform the dressing of the dressing surface 62a based on the polishing information. Depending on the polished state of the wafer W, the dressing of the dressing surface 62a may not be required. As the second dressing processing is repeated, the auxiliary dressing surface 65a may be abraded. In the above-described configuration, however, it is determined based on the polishing information indicating the polished state whether or not to perform the second dressing processing. As a consequence, the lifetime of the auxiliary dressing member 65 can be lengthened.

So far, the exemplary embodiments have been described. However, the present disclosure is not limited to the above-described exemplary embodiments, and various changes and modifications may be made without departing from the scope of the present disclosure.

Modification Examples (1) The control device 100 may perform the individual processes in the above-described polishing sequence in parallel, or change an order of the processes. By way of example, the control device 100 may perform the first dressing processing of the process S03 after performing the polishing processing of the process S02.

(2) The control device 100 may acquire, as the surface information, abrasion information which indicates the abrasion state (degradation state) of the dressing surface 62a instead of the polishing information of the rear surface Wb of the wafer W. In this case, the polishing unit 20 may be equipped with, instead of the inspecting unit 80, an inspecting unit 81 which is disposed diagonally below the dressing surface 62a (see FIG. 5A, etc.). The inspecting unit 81 may have, for example, a function of emitting light for inspection toward the dressing surface 62a and a function of receiving light (hereinafter, referred to as "scattered light") scattered on the dressing surface 62a. The control device 100 may acquire the abrasion information based on information indicated by the received scattered light. Further, the control device 100 may decide, based on the abrasion information, whether the sharpening of the dressing surface 62a is needed.

(3) Alternatively, the control device 100 may acquire, as the surface information, abrasion information indicating an abrasion state of the auxiliary dressing surface 65a. The abrasion information of the auxiliary dressing surface 65a may be acquired in the same way as the above-described abrasion information of the dressing surface 62a. Based on this abrasion information of the auxiliary dressing surface 65a, the control device 100 may determine whether the sharpening of the dressing surface 62a is required. Further, the control device 100 may determine whether or not to perform the second dressing processing based on the abrasion states of both the dressing surface 62a and the auxiliary dressing surface 65a.

In these modification examples, the control device 100 acquires the abrasion information indicating the abrasion state of at least one of the dressing surface 62a or the auxiliary dressing surface 65a, and decides whether or not to perform the second dressing processing based on the acquired abrasion information. The dressing of the dressing surface 62a may not be required depending on the abrasion state of the dressing surface 62a or the auxiliary dressing surface 65a. In the above-described configuration, since whether to perform the second dressing processing is determined based on the abrasion information indicating the abrasion state, the lifetime of the auxiliary dressing member 65 can be lengthened as compared to the case where the dressing of the dressing surface 62a is performed whenever the polishing of the rear surface Wb of the wafer W is performed.

(4) The control device 100 may perform the second dressing processing based on the repetition number of the first dressing processing without needing to acquire the surface information. By way of example, the control device 100 may perform the second dressing processing a single time after the first dressing processing is performed multiple times. That is, the control device 100 may perform the second dressing processing a single time whenever the polishing is performed on multiple wafers W multiple times. At this time, after the dressing of the polishing surface 51a is performed multiple times, the rotational driving units 532 and 542 may perform the switchover from the first state in which the dressing of the polishing surface 51a is performed into the second state in which the dressing of the dressing surface 62a is performed.

In this modification example, the dressing of the polishing surface 51a (the first dressing processing) is performed whenever the polishing upon the wafer W as the processing target is carried out. The driving units belonging to the driving device 52 performs the switchover from the first state into the second state after the dressing of the polishing surface 51a is performed the multiple times. The dressing of the dressing surface 62a may not be required after the dressing of the polishing surface 51a is performed a single time. In the above-configuration, since the dressing of the dressing surface 62a is performed after the dressing of the polishing surface 51a is performed the multiple times, the lifetime of the auxiliary dressing member 65 can be further lengthened.

(5) In some examples, the control device 100 performs the second dressing processing of the process S06 after determining, based on the surface information, whether the sharpening of the dressing surface 62a is required. Alternatively, the control device 100 may perform the second dressing processing a single time whenever the first dressing processing is performed multiple times. The method of performing the second dressing processing, however, is not limited to the aforementioned examples. For example, the control device 100 may not acquire the surface information and may perform both the first dressing processing and the second dressing processing whenever the polishing upon the wafer W as the processing target is performed. In this case, as for a timing for performing the second dressing processing, the second dressing processing may be performed before or after the first dressing processing, or performed before or after the polishing processing. In this modification example, since the second dressing processing is performed whenever the polishing of the single sheet of the wafer W is performed, the sharpening of the dressing surface 62a for dressing the polishing surface 51a can be carried out more securely.

(6) The control device 100 may acquire the polishing information (for example, image data) from another inspecting unit separate from the polishing unit 20.

(7) The substrate as the processing target is not limited to the semiconductor wafer, and may be, by way of non-limiting example, a glass substrate, a mask substrate, a FPD (Flat Panel Display), or the like.

According to the exemplary embodiment, it is possible to provide the substrate processing apparatus and a substrate processing method capable of carrying on a stable polishing processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
   a polishing member having a polishing surface configured to perform a polishing of a main surface of a substrate;
   a first dressing member having a first dressing surface configured to perform a dressing of the polishing surface;
   a second dressing member having a second dressing surface configured to perform a dressing of the first dressing surface;
   a holding member configured to hold the polishing member and the second dressing member; and
   a driving device configured to, by moving the holding member, switch a first state in which the first dressing surface and the polishing surface come into contact with each other to perform the dressing of the polishing surface and a second state in which the first dressing surface and the second dressing surface come into contact with each other to perform the dressing of the first dressing surface.

2. The substrate processing apparatus of claim 1,
   wherein the second dressing member and the polishing member are fixed on a single surface of the holding member, and height positions of the polishing surface and the second dressing surface are different,
   the first dressing surface faces the polishing surface and the second dressing surface, and
   the driving device switches the first state and the second state by changing positions of the polishing surface and the second dressing surface when viewed from a top, and, also, by changing a distance between the holding member and the first dressing surface.

3. The substrate processing apparatus of claim 2,
   wherein a hardness of the second dressing member is lower than a hardness of the first dressing member.

4. The substrate processing apparatus of claim 3,
   wherein the driving device moves a contact position of the second dressing surface in the second state to cover a contact area of the first dressing surface which has been in contact with the polishing surface when the dressing of the polishing surface is performed in the first state.

5. The substrate processing apparatus of claim 4, further comprising:
   a controller configured to control the driving device,
   wherein the driving device comprises a first driving unit configured to rotate the holding member to allow the polishing member to be rotated around a first axis, and a second driving unit configured to move the holding unit to allow the first axis to be moved along a circular orbit around a second axis which is parallel to the first axis,
   the controller is further configured to controls the first driving unit to rotate the holding member so that positions of the polishing surface and the second dressing surface when viewed from a top are changed, and
   the controller is further configured to controls the second driving unit to move the holding member so that the contact position of the second dressing surface with respect to the contact area is moved in the second state.

6. The substrate processing apparatus of claim 5,
   wherein the dressing of the polishing surface is performed whenever the polishing upon the substrate as a processing target is performed, and
   the driving device performs a switchover from the first state into the second state after the dressing of the polishing surface is performed multiple times.

7. The substrate processing apparatus of claim 1,
   wherein a hardness of the second dressing member is lower than a hardness of the first dressing member.

8. The substrate processing apparatus of claim 1,
   wherein the driving device moves a contact position of the second dressing surface in the second state to cover a contact area of the first dressing surface which has been in contact with the polishing surface when the dressing of the polishing surface is performed in the first state.

9. The substrate processing apparatus of claim 8, further comprising:
a controller configured to control the driving device,
wherein the driving device comprises a first driving unit configured to rotate the holding member to allow the polishing member to be rotated around a first axis, and a second driving unit configured to move the holding unit to allow the first axis to be moved along a circular orbit around a second axis which is parallel to the first axis,
the controller is further configured to controls the first driving unit to rotate the holding member so that positions of the polishing surface and the second dressing surface when viewed from a top are changed, and
the controller is further configured to control the second driving unit to move the holding member so that the contact position of the second dressing surface with respect to the contact area is moved in the second state.

10. The substrate processing apparatus of claim 1, further comprising:
a controller configured to acquire polishing information which indicates a polished state of the main surface of the substrate after the polishing is performed by the polishing member,
wherein the controller is further configured to determine, based on the polishing information, whether or not to perform the dressing of the first dressing surface.

11. The substrate processing apparatus of claim 1, further comprising:
a controller configured to acquire abrasion information which indicates an abrasion state of at least one of the first dressing surface or the second dressing surface,
wherein the controller is further configured to determines, based on the abrasion information, whether or not to perform the dressing of the first dressing surface.

12. The substrate processing apparatus of claim 1,
wherein the dressing of the polishing surface is performed whenever the polishing upon the substrate as a processing target is performed, and
the driving device performs a switchover from the first state into the second state after the dressing of the polishing surface is performed multiple times.

* * * * *

UNITED STATES PATENT AND TRADEMARK OFFICE
CERTIFICATE OF CORRECTION

PATENT NO. : 11,532,487 B2
APPLICATION NO. : 16/872441
DATED : December 20, 2022
INVENTOR(S) : Akihiro Kubo et al.

It is certified that error appears in the above-identified patent and that said Letters Patent is hereby corrected as shown below:

In the Specification

Column 16, Line 47, "and the axis Ax1" should be -- and the axis Ax2 --.

Column 21, Line 23, "Ax1 which is parallel" should be -- Ax2 which is parallel --.

Signed and Sealed this
Thirty-first Day of October, 2023

Katherine Kelly Vidal
*Director of the United States Patent and Trademark Office*